United States Patent
Hébert et al.

(10) Patent No.: US 8,058,960 B2
(45) Date of Patent: Nov. 15, 2011

(54) CHIP SCALE POWER CONVERTER PACKAGE HAVING AN INDUCTOR SUBSTRATE

(75) Inventors: François Hébert, San Mateo, CA (US); Ming Sun, Sunnyvale, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 300 days.

(21) Appl. No.: 11/729,311

(22) Filed: Mar. 27, 2007

(65) Prior Publication Data

US 2008/0238599 A1    Oct. 2, 2008

(51) Int. Cl.
*H01F 5/00* (2006.01)
*H01F 27/28* (2006.01)
*H01F 7/06* (2006.01)
*H05K 7/00* (2006.01)

(52) U.S. Cl. ........ 336/200; 336/232; 361/760; 29/602.1

(58) Field of Classification Search .................. 336/200, 336/232; 361/760; 29/602.1
See application file for complete search history.

(56) References Cited

U.S. PATENT DOCUMENTS

| | | | |
|---|---|---|---|
| 5,747,870 A * | 5/1998 | Pedder ........................... | 257/531 |
| 5,802,702 A * | 9/1998 | Fleming et al. ............... | 336/200 |
| 5,909,050 A * | 6/1999 | Furey et al. ................... | 257/531 |
| 6,031,445 A * | 2/2000 | Marty et al. ................... | 336/200 |
| 6,441,715 B1 * | 8/2002 | Johnson ......................... | 336/200 |
| 7,068,138 B2 * | 6/2006 | Edelstein et al. ............. | 336/200 |
| 7,355,282 B2 * | 4/2008 | Lin et al. ....................... | 257/758 |
| 2004/0208032 A1 * | 10/2004 | Edo et al. ...................... | 363/147 |
| 2005/0146018 A1 * | 7/2005 | Jang et al. ...................... | 257/698 |
| 2005/0146411 A1 * | 7/2005 | Gardner ......................... | 336/200 |
| 2005/0184357 A1 * | 8/2005 | Chiba ............................ | 257/531 |
| 2005/0263847 A1 * | 12/2005 | Anzai et al. ................... | 257/531 |
| 2006/0039224 A1 * | 2/2006 | Lotfi et al. ..................... | 365/226 |
| 2007/0090912 A1 * | 4/2007 | Lee ................................ | 336/200 |

FOREIGN PATENT DOCUMENTS

| GB | 2173956 A | * | 10/1986 |
|---|---|---|---|
| JP | 2002233140 A | * | 8/2002 |

* cited by examiner

*Primary Examiner* — Lincoln Donovan
*Assistant Examiner* — Tsz Chan
(74) *Attorney, Agent, or Firm* — James Cai; Schein & Cai LLP

(57) ABSTRACT

A chip scale power converter package having an inductor substrate and a power integrated circuit flipped onto the inductor substrate is disclosed. The inductor substrate includes a high resistivity substrate having a planar spiral inductor formed thereon.

36 Claims, 9 Drawing Sheets

CHIP SCALE POWER CONVERTER PACKAGE HAVING AN INDUCTOR SUBSTRATE

BACKGROUND OF THE INVENTION

1. Field of the Invention

The present invention generally relates to chip scale packaging and more particularly to a chip scale power converter package having an inductor substrate.

2. Description of Related Art

It is well known to include a discrete inductor on the printed circuit board when implementing a power converter circuit. For example, the Analogic™TECH 1 MHz 400 mA Step-Down Converter (AAT1143) requires the use of a discreet inductor. Power converters implemented in this way suffer the disadvantages of having higher component cost and of requiring more printed circuit board space.

Discrete inductors co-packaged with power ICs and other components are also well known. For example, the LTM®4600 DC/DC power converter available from Linear Technology Corporation of Milpitas, Calif., includes a built-in inductor in a 15 mm×15 mm×2.8 mm package. The package disadvantageously uses valuable printed circuit board space.

It is further known to dispose an inductor on top of an integrated circuit die such as a power converter integrated circuit die. For example, power converters available from Enpirion of Bridgewater, N.J., include a MEMS-based inductor having a thick electroplated copper spiral coil sandwiched between two planar magnetic layers and disposed over an integrated DC-DC converter. To achieve high inductance, a large die is required resulting in a high cost and a large package. Furthermore, complex processing is necessary in order to fabricate the planar magnetic layers.

There is therefore a need in the art for a chip scale power converter that overcomes the disadvantages of the prior art. There is a need for a low cost chip scale power converter that does not require an external inductor. There is a further need for a chip scale power converter having an optimized interconnection between the power IC and the inductor for minimized parasitics, improved performance and high reliability.

SUMMARY OF THE INVENTION

The chip scale power converter in accordance with the invention combines an inductor with the chip scale package to improve efficiency of assembly. An inductor substrate is provided that includes an optimized planar spiral inductor. A power IC is flipped onto the inductor substrate to form the chip scale power converter.

In accordance with one aspect of the invention, a power converter package includes an inductor substrate and a power integrated circuit bonded onto the inductor substrate.

In accordance with another aspect of the invention, a chip scale inductor substrate includes a high resistivity substrate, and a planar spiral inductor formed on the substrate.

In accordance with another aspect of the invention, a method of fabricating a chip scale power converter package includes the steps of providing a substrate, fabricating a plurality of planar spiral inductors on the substrate to form a plurality of inductor substrates, bonding an integrated circuit onto each inductor substrate, and dicing the plurality of inductor substrates.

There has been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended herein.

In this respect, before explaining at least one embodiment of the invention in detail, it is to be understood that the invention is not limited in its application to the details of functional components and to the arrangements of these components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF A PREFERRED EMBODIMENT OF THE INVENTION

The present invention will now be described in detail with reference to the drawings, which are provided as illustrative examples of the invention so as to enable those skilled in the art to practice the invention. Notably, the figures and examples below are not meant to limit the scope of the present invention. Where certain elements of the present invention can be partially or fully implemented using known components, only those portions of such known components that are necessary for an understanding of the present invention will be described, and detailed descriptions of other portions of such known components will be omitted so as not to obscure the invention. Further, the present invention encompasses present and future known equivalents to the components referred to herein by way of illustration.

Figure 1:
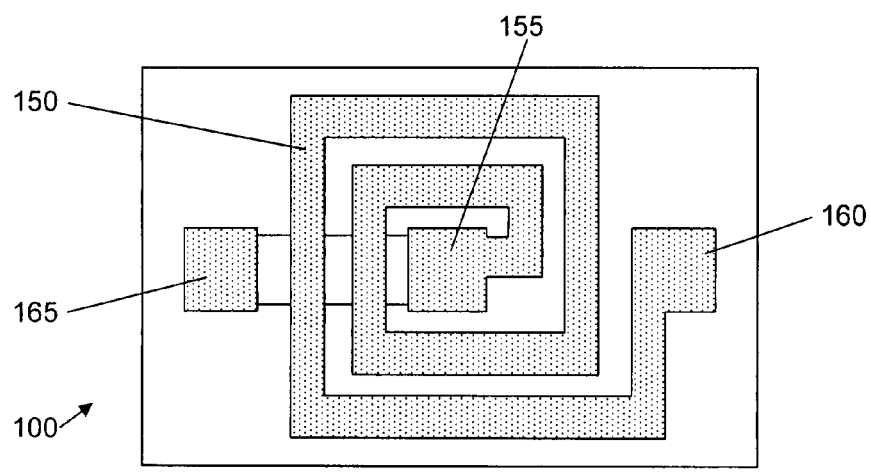
FIG. 1 is a top plan view of an inductor substrate in accordance with the invention.
Figure 2:
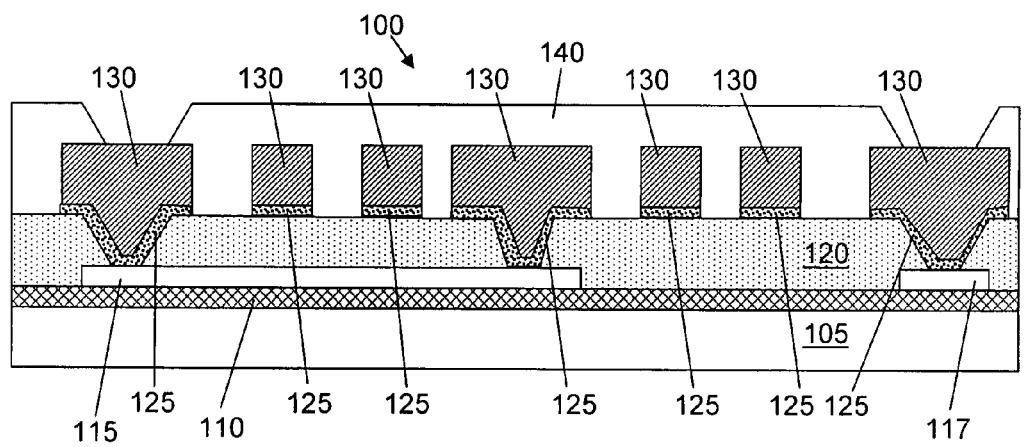
FIG. 2 is a cross sectional view of the inductor substrate of FIG. 1.

The present invention provide a chip scale power converter having an inductor substrate. An exemplary inductor substrate 100 is shown in FIG. 1 and FIG. 2. Inductor substrate includes a substrate 105 formed of a high resistivity material including silicon and glass, or a magnetic core material such as Ferrite or NiFe, or a multi-layered structure of magnetic core material and oxide over silicon wafer or other substrate wafer. A planar spiral/spirangle inductor 105 having a first end 155 and a second end 160 is formed on the substrate 105 as further detailed herein.

An oxide layer 110 is formed over the substrate 105. Optional cross over metal layers 115 and 117 are formed of metal or alloys including Cu, AlCu, and Cu/TiW over portions of the oxide layer 110. Cross over metal layer 115 provides contact to the planar spiral inductor first end 155 at peripheral contact 165.

An optional layer 120 of inter-metal dielectric material, preferably a low-K dielectric material including benzocyclobutene (BCB), polyimide and other organic materials such as SU-8 available from MicroChem of Newton, Mass., is disposed over the oxide layer 110 and layers 115 and 117 to provide for low parasitic capacitance. Optional barrier metal layers 125 may be disposed between layers 115 and 117, and thick metal structures 130 defining the planar spiral inductor 150. The thick metal structures 130 may be formed of Cu or other thick and low resistivity metals such as Au. A passivation layer 140 covers the planar spiral inductor 150 to complete the inductor substrate 100. Alternatively, optional cross over metal layers 115 and 117 may be formed over a passivation layer 140 to provide contact to the planar spiral inductor first end 155 at peripheral contact 165.

Figure 3:
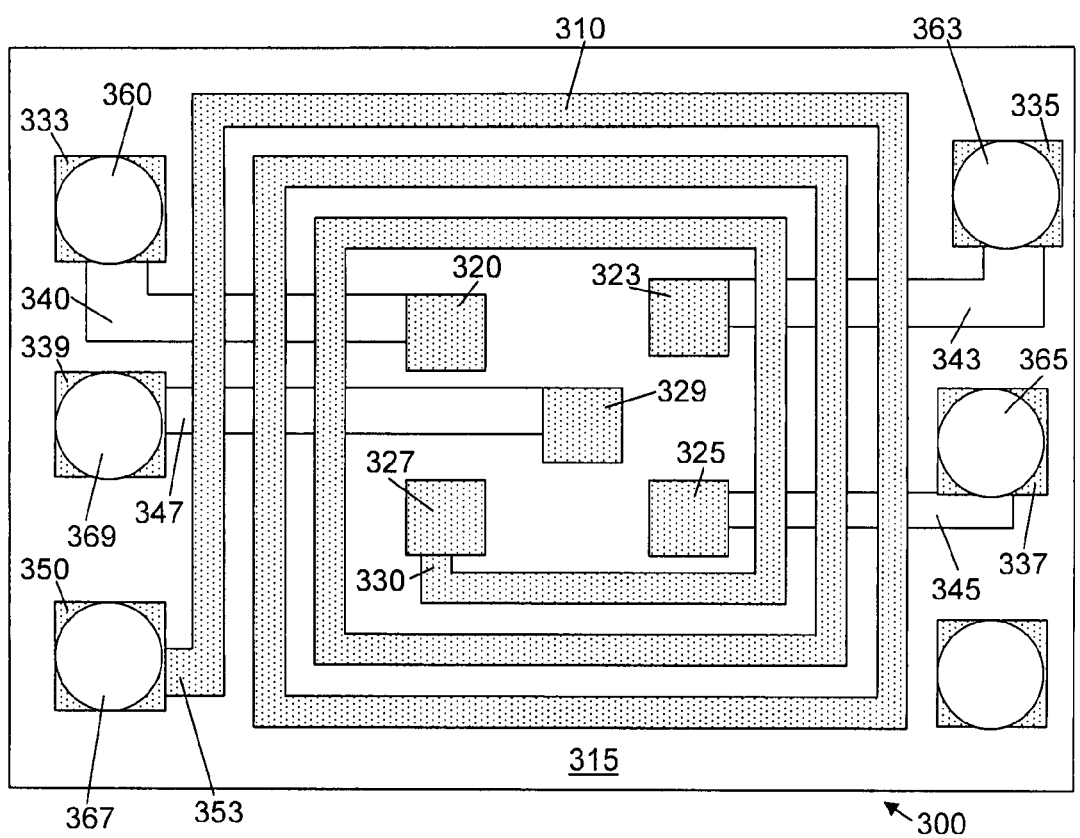
FIG. 3 is a top plan view of an alternative inductor substrate in accordance with the invention.

A preferred embodiment of an inductor substrate 300 is shown in FIG. 3. A planar spiral/spirangle inductor 310 is disposed on a substrate 315 so as to maximize the inductance of the inductor 130. Contacts 320, 323, 325, 327 and 329 provide contacts for a flip-chip power IC controller/converter as further described herein. Contact 327 is electrically coupled to a first end 330 of the planar spiral/spirangle inductor 310. Contacts 320, 323, 325 and 329 are coupled to contacts 333, 335, 337 and 339 respectively by means of cross over metal layers 340, 343, 345 and 347. Contact 350 is electrically coupled to a second end 353 of the planar spiral/spirangle inductor 310. Solder bumps 360, 363, 365, 367 and 369 provide connectivity to contacts 333, 335, 337, 350, and 339, respectively.

Figure 4:
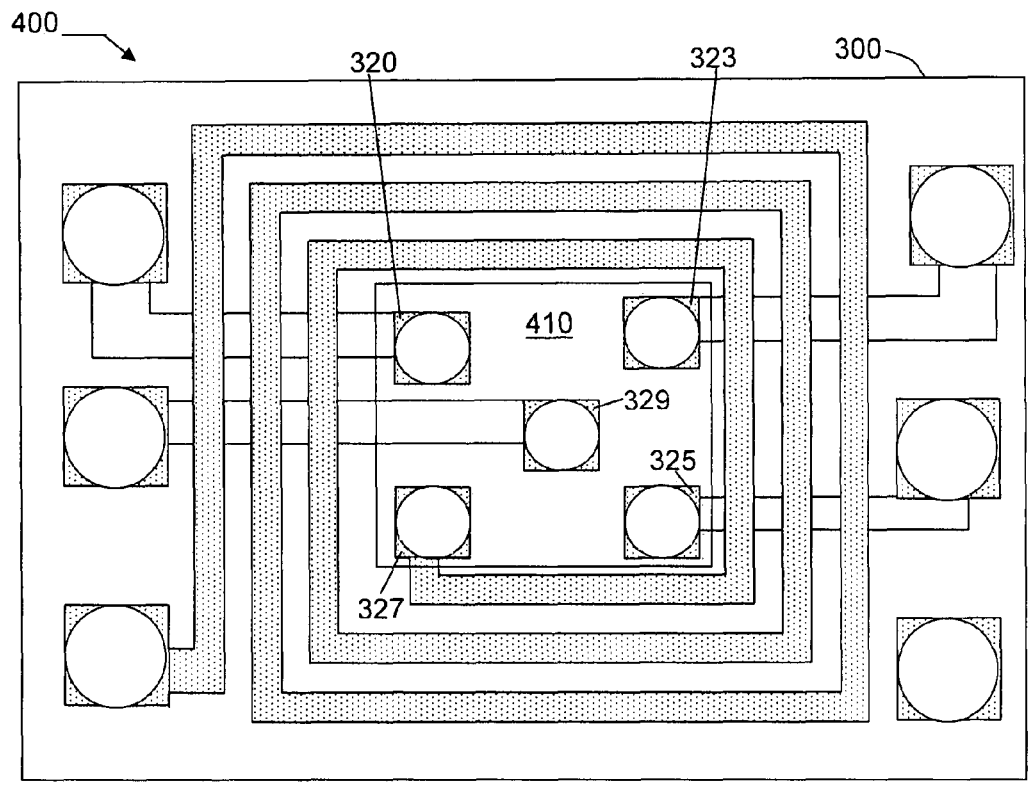
FIG. 4 is a top plan view of a chip scale power converter package showing a flip chip power IC in phantom in accordance with the invention.
Figure 5:
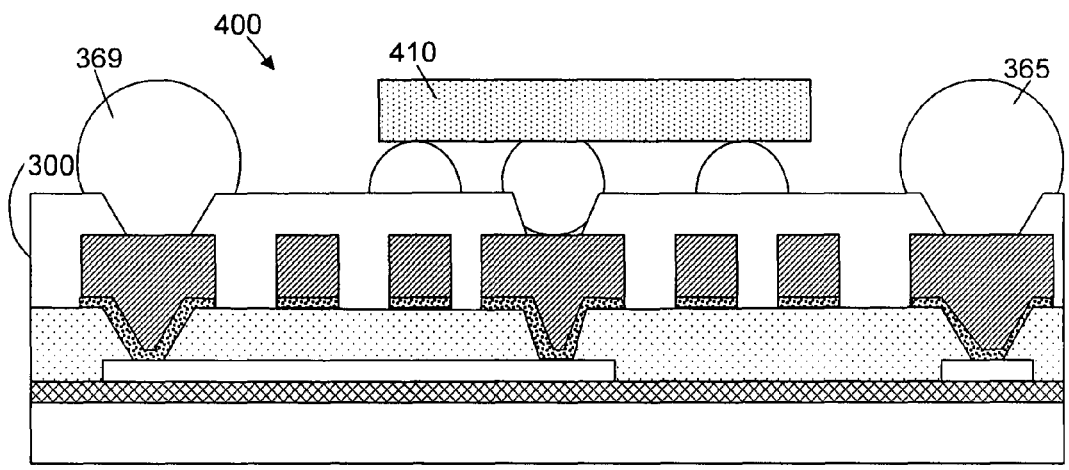
FIG. 5 and FIG. 5A are cross sectional views of chip scale power converter packages in accordance with the invention.
Figure 5A:
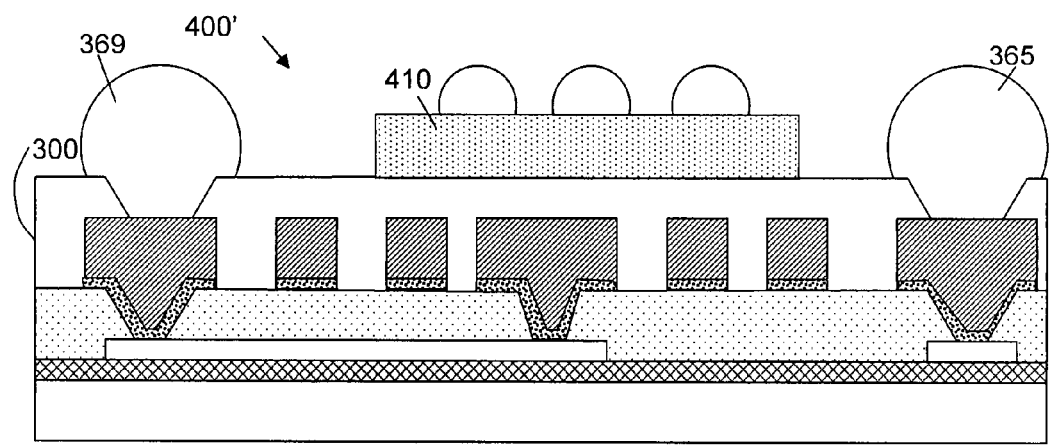
Figure 6:
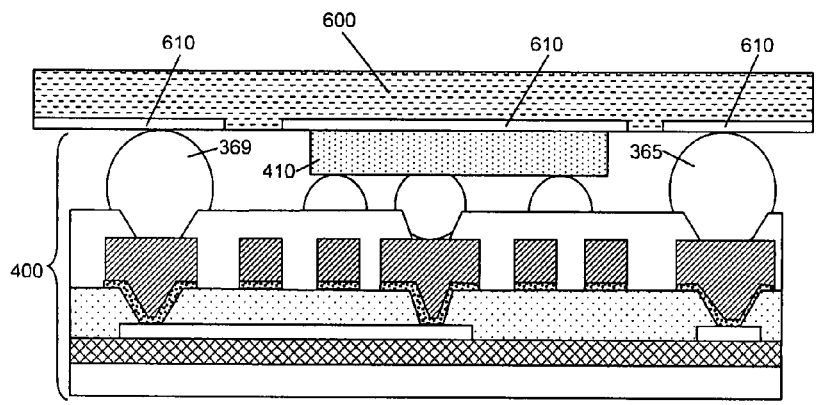
FIG. 6 is a cross sectional view of the chip scale power converter package of FIG. 4 mounted to a printed circuit board in accordance with the invention.

With reference to FIG. 4, a chip scale power converter 400 is shown including a flip-chip power IC controller/converter 410 electrically coupled to the inductor substrate 300. The flip-chip power IC controller/converter 410 is shown in phantom to show connection to contacts 320, 323, 325 and 327. A cross sectional view of the chip scale power converter 400 is shown in FIG. 5. The chip scale power converter 400 is shown in FIG. 6 mounted to a printed circuit board 600 having traces 610. Alternatively, contacts 320, 323, 325, 327 and 329 are not provided and an IC chip 410 may be mounted on the inductor substrate 300 with contacts exposed to form a chip scale power converter 400' as shown in FIG. 5A. In case the IC chip 410 has contacts on both its surfaces, some contacts may be accessed directly from one surface of IC chip 410 and some contacts may be accessed from contacts on the inductor substrate through cross over metals. Furthermore, the solder bump contacts may be replaced by patterned metal contact pads so that the combined inductor substrate with the IC chip can be packed into traditional packages by wire bonding.

Figure 7:
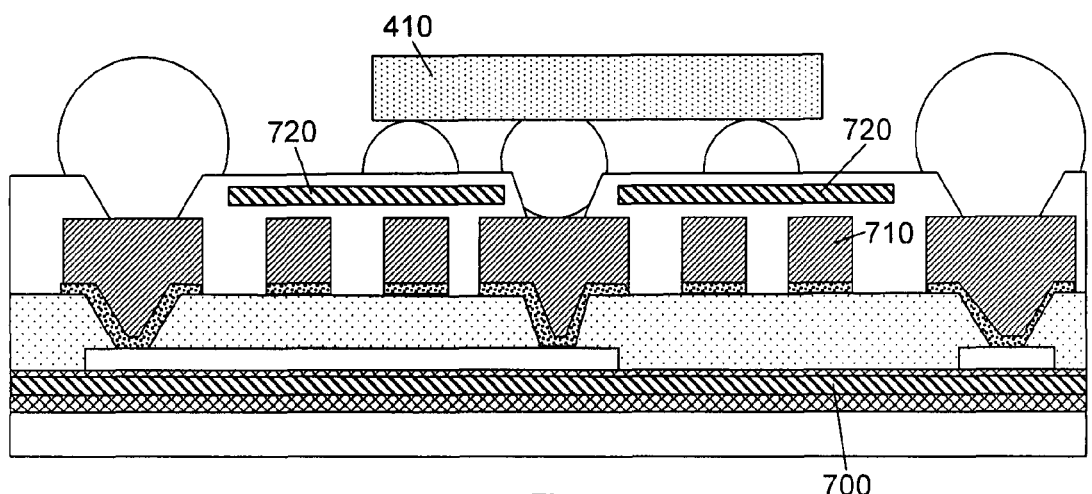
FIG. 7 is a cross sectional view of an alternative chip scale power converter package in accordance with the invention.

In alternative embodiments, a patterned magnetic core layer is formed under the planar spiral inductor in the substrate. Alternatively, a patterned magnetic core layer is formed above the planar spiral inductor. In yet other alternative embodiments, patterned magnetic core layers are formed above and below the planar spiral inductor. In yet other alternative embodiments, multi-layered patterned magnetic core layers sandwiched by dielectric layers such as silicon oxides are formed above and/or below the planar inductor. Provision of patterned magnetic core layers increases the inductance per unit area of the spiral inductor and provides shielding of stray magnetic fields. With reference to FIG. 7, a patterned magnetic core layer 700 is shown formed under the planar spiral inductor 710 and a patterned magnetic core layer 720 is shown formed over the planar spiral inductor 710. The magnetic core layers 700 and 720 can be sputtered, evaporated, plated, bonded or co-packaged as a chip on the inductor substrate. Magnetic core layers 700 and 720 may be formed of materials with appropriate magnetic performance such as Ni, Co, ferrites, and combinations of these materials.

Figure 8:
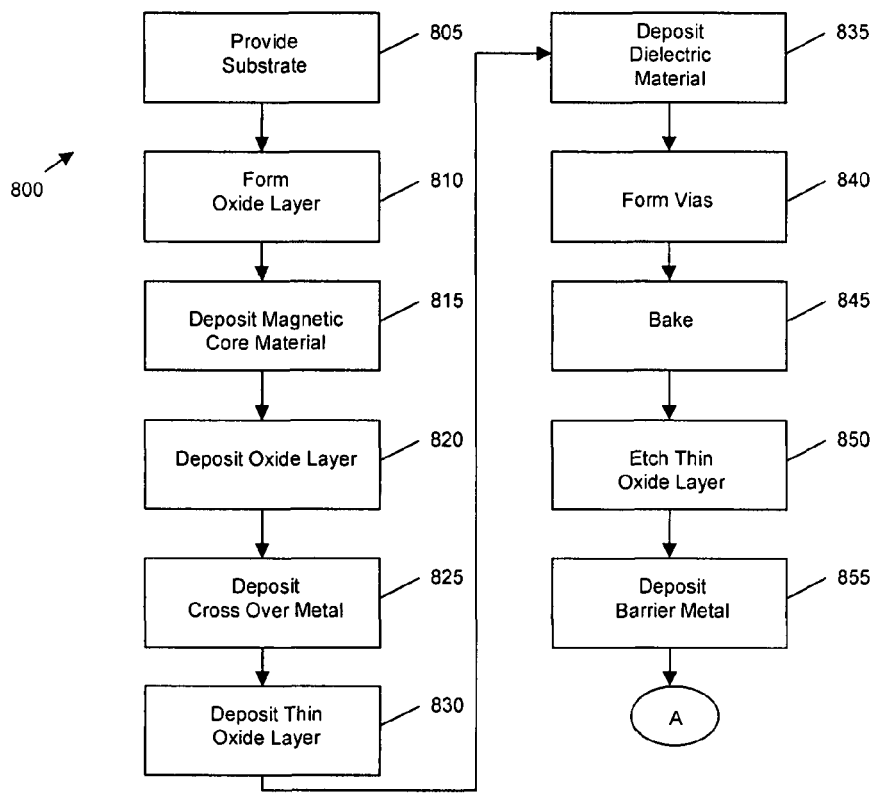
FIG. 8 and FIG. 9 are a flow chart showing a method in accordance with the invention.
Figure 9:
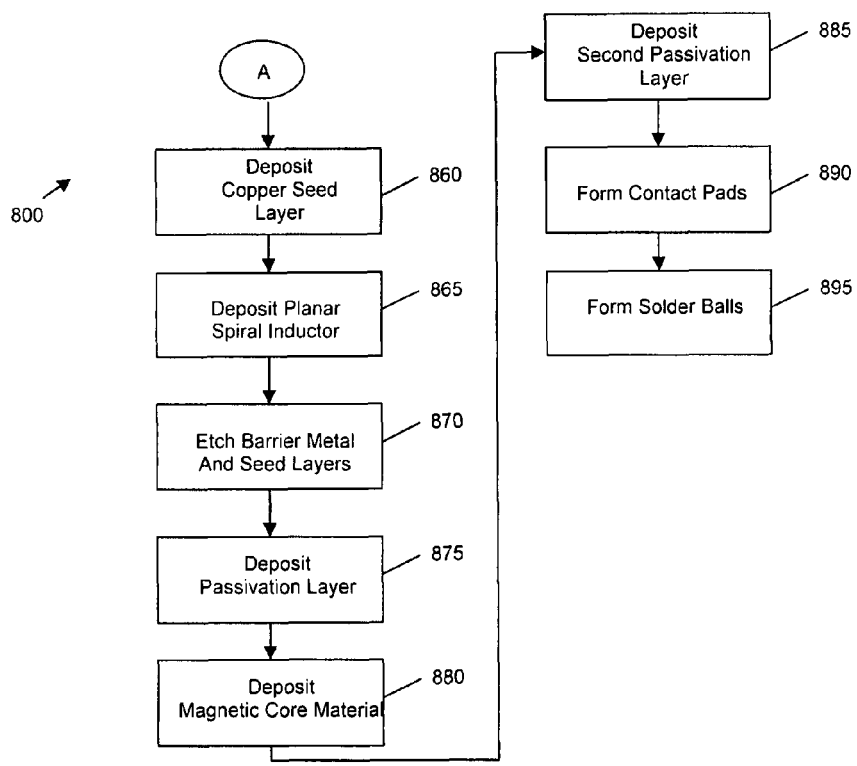
Figure 10:
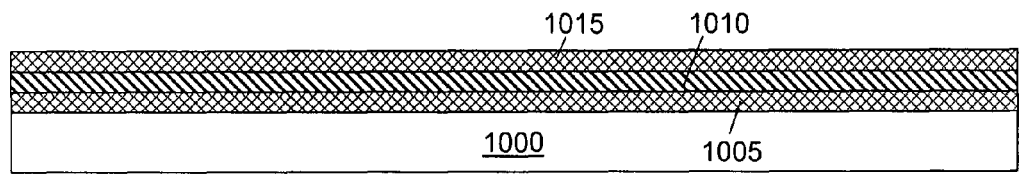
FIG. 10 through FIG. 16 shows an inductor substrate in various stages of fabrication in accordance with the invention.

A method 800 (FIG. 8) of fabricating the inductor substrate in accordance with the invention includes providing a high resistivity substrate wafer 1000 (FIG. 10) in a step 805. The substrate 1000 is thermally oxidized to form an oxide layer 1005 in a step 810. In an optional step 815 a magnetic core material such as electroplated permalloy is deposited on the oxide layer 1005 to form a magnetic core layer 1010 and in a step 820, an oxide or dielectric layer 1015 is deposited on the magnetic core layer 1010.

Figure 11:
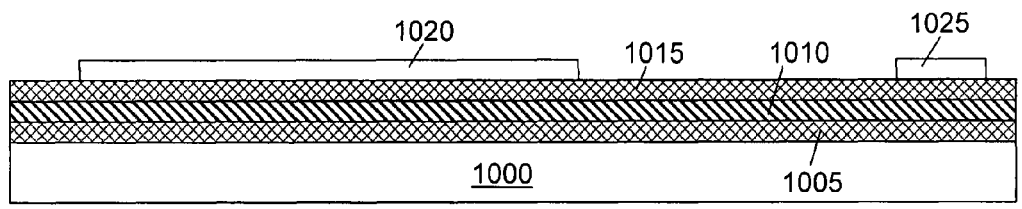

In a optional step 825, cross over metal 1020 and 1025 (FIG. 11) is deposited onto oxide or dielectric layer 1015 such as by thick AlCu deposition (>1.5 microns), sputtered Cu/TiW, or plated Cu. Step 825 may include masking, stripping, and etching processes.

Figure 12:
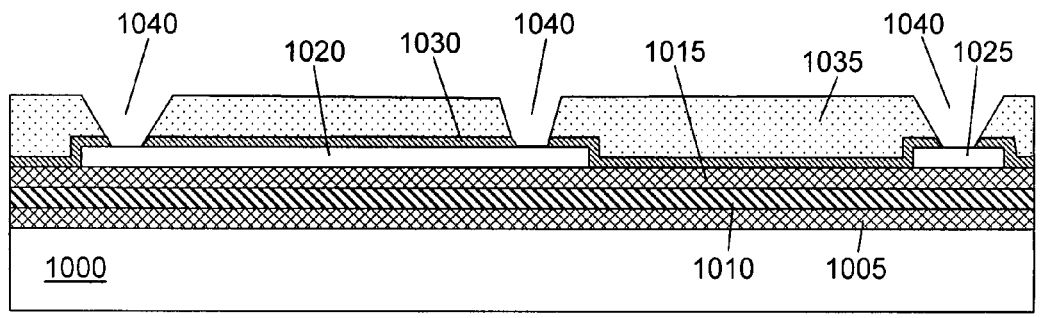

A thin oxide layer 1030 (FIG. 12) is next deposited to promote adhesion of a low-K inter-metal dielectric material including benzocyclobutene (BCB), polyimide or SU-8, in a step 830. In an optional step 835, the BCB 1035 is spun to a thickness of 10 to 20 microns. Vias 1040 are next formed in a step 840 including masking and developing the BCB or polyimide (in the case photodefined BCB or polyimide is used) or developing and etching the BCB (in the case non-photodefined BCB or polyimide is used). The structure is next baked in a step 845 and the thin oxide layer 1030 is etched in a step 850 using the BCB, polyimide or SU-8 layer as mask.

Figure 13:
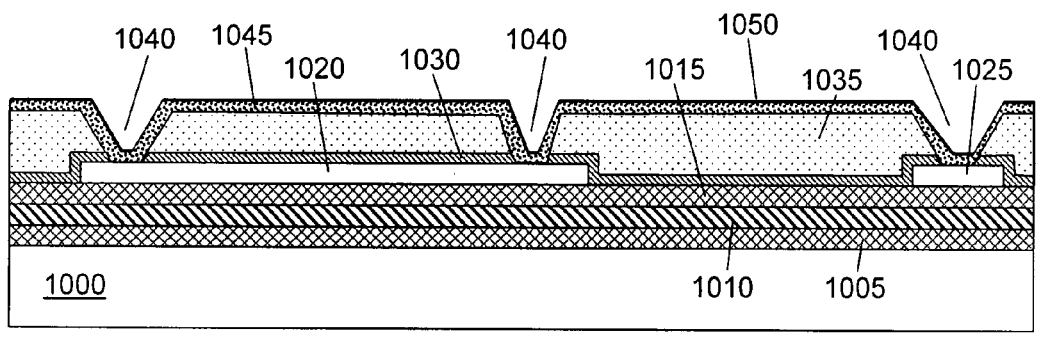
Figure 14:
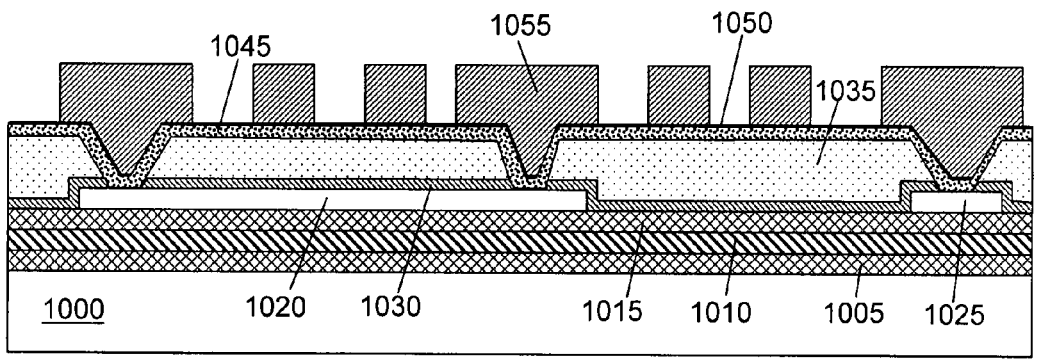

A barrier metal 1045 (FIG. 13) including TiW or TiN is next deposited in a step 855 and a copper seed layer 1050 deposited in a step 860 overlaying barrier metal layer 1045. In a step 865, a thick photoresist layer is patterned, copper is electroplated to a thickness of 17 microns or greater, and the photoresist stripped to form a planar spiral inductor 1055 (FIG. 14). Alternatively, the copper layer may be deposited over the whole substrate and then patterned and etched with a mask. A low resistivity metal like Gold (commonly used in RF and microwave power devices for example), can be used in place of Cu.

Figure 15:
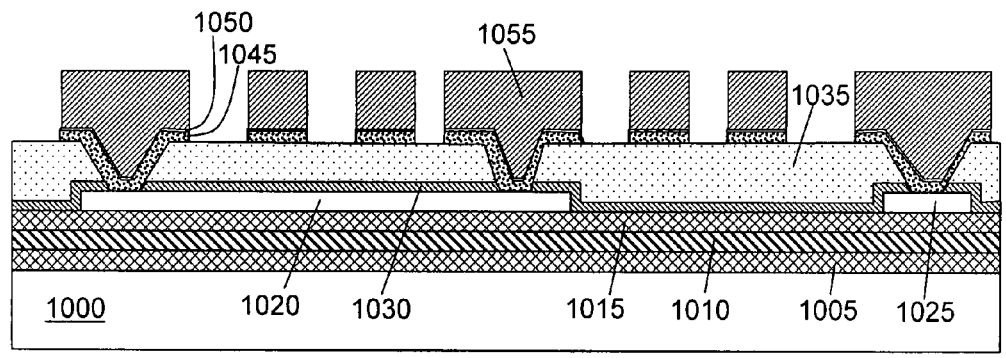
Figure 16:
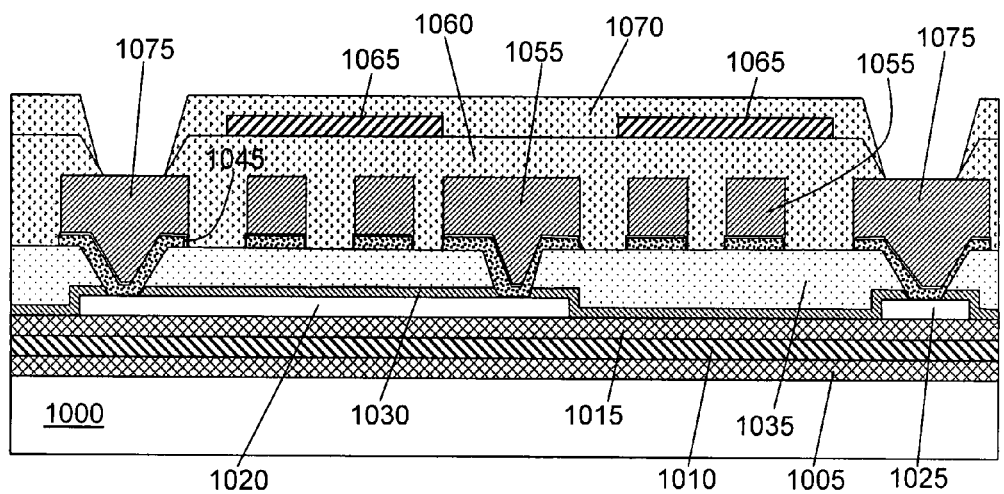

The barrier metal 1045 and the seed layer 1050 are next etched in a step 870 (FIG. 15). In a step 875, a passivation layer 1060 (FIG. 16) formed of BCB or polyimide is deposited. Magnetic core material is next deposited and patterned or plated in an optional step 880 to form magnetic core layer 1065. A second passivation layer 1070 is then deposited in a step 885. Contact pads 1075 are masked and etched in a step 890 and solder bumps (not shown) formed in a step 895. In another embodiment, a layer of metal is deposited and then patterned to form cross over metals (not shown) before solder bumps are formed in step 895. Following the process 800, an IC chip may be attached to the inductor substrate by a standard bonding process or by a flip-chip bonding process and the whole inductor substrate diced into individual packages.

Figure 17:
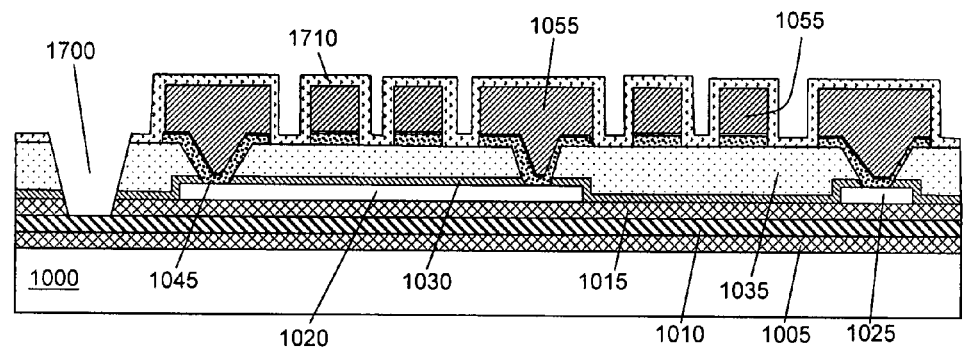
FIGS. 17 and 18 show an alternative inductor substrate in various stages of fabrication in accordance with the invention.
Figure 18:
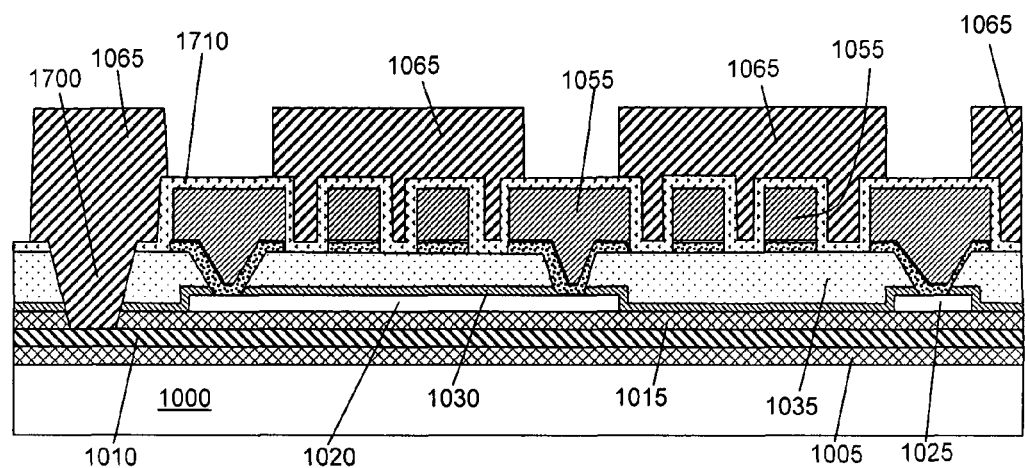
Figure 19:
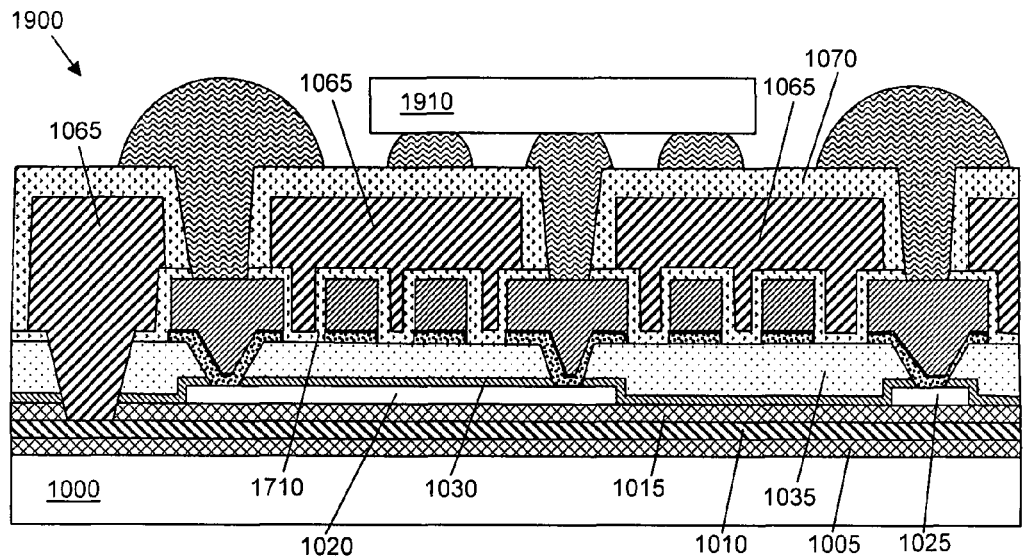
FIG. 19 is a cross sectional view of an alternative chip scale power converter package in accordance with the invention.

In an alternative embodiment of the invention, a peripheral magnetic via 1700 to the magnetic core layer 1010 is formed following the step 875 in which a passivation layer 1710 (FIG. 17) is formed over the planar spiral inductor 1055. Magnetic core material is then deposited as a blanket layer and patterned or plated in the step 880 (FIG. 18) to form magnetic core layer 1065. Magnetic core material in via 1700 connects the magnetic core layer 1065 with the magnetic core layer 1010 to maximize the inductance of the spiral inductor 1055. An inductor substrate 1900 and mounted power IC flip chip 1910 is shown in FIG. 19. Maximum inductance is achieved by contact between the magnetic core layers but a separation on the order of a few microns is acceptable.

The chip scale power converter having an inductor substrate of the invention combines the inductor in the package to improve efficiency of assembly. The inventive package does not integrate the inductor directly with the more costly power IC. By flipping the power IC onto the inductor substrate, optimized interconnection between the power IC and the inductor is provided to minimize parasitics, improve performance and achieve high reliability.

The chip scale power converter having an inductor substrate according to the invention is particularly suited for high frequency (>5 MHz) applications requiring lower inductance values. It is also suited for low current applications to leverage the planar spiral inductor. The inductor substrate of the invention is simple to fabricate at a low cost and maximizes the inductance while minimizing cost and space.

It is apparent that the above embodiments may be altered in many ways without departing from the scope of the invention. For example, the inductor substrate may be formed without the magnetic core materials and optional components including resistors and capacitors may be formed in the substrate. Additionally, high power MOSFET devices may be incorporated in the substrate. Further, various aspects of a particular embodiment may contain patentably subject matter without regard to other aspects of the same embodiment. Still further, various aspects of different embodiments can be combined together. Accordingly, the scope of the invention should be determined by the following claims and their legal equivalents.

What is claimed is:

1. A power converter package comprising:
   an inductor substrate having an electrically conductive path formed from a plurality of line segments disposed on a surface, defining a spirangle inductor, the spirangle inductor comprising the plurality of line segments being straight line segments, the plurality of straight line segments maximizing an inductance of the spirangle inductor, the spirangle inductor being a predetermined angled spirangle originating at a first end and making a number of turns to a second end, wherein the plurality of straight line segments occupy substantially the same plane; and
   a power integrated circuit bonded onto the spirangle inductor substrate and in superimposition with a region of said surface, with a subset of said plurality of line segments lying outside of said region, and a plurality of contacts on said surface being outside of the spirangle inductor being connected respectively to a plurality of contacts on said surface being connected to the power integrated circuit and enclosed by the spirangle inductor by a cross over metal layer without connecting to an end of the spirangle inductor.

2. The power converter according to claim 1, wherein said power integrated circuit is bonded to said region.

3. The power converter according to claim 1, wherein the conductive path has a thickness greater than 17 microns.

4. The power converter according to claim 1, further comprising a magnetic core layer in superimposition with said spirangle inductor.

5. The power converter according to claim 4, wherein said magnetic core layer is disposed between said spirangle inductor and said power integrated circuit.

6. The power converter according to claim 2, further comprising first and second magnetic core layers coupled by means of a magnetic core material via, with said spirangle inductor being positioned between said first and second magnetic core layers.

7. The power converter according to claim 2, wherein the power integrated circuit comprises a plurality of contacts coupled to a plurality of peripheral contacts on the inductor substrate by means of a cross over metal layer.

8. The power converter according to claim 2, wherein the power integrated circuit is flip chip bonded onto the inductor substrate.

9. A chip scale inductor substrate comprising:
   a high resistivity substrate having a plurality of contacts disposed on a region thereof; and
   a conductive path formed from a plurality of line segments surrounding said region and defining a spirangle inductor on a surface of the substrate, the spirangle inductor comprising the plurality of line segments being straight line segments, the plurality of straight line segments maximizing an inductance of the spirangle inductor, the spirangle inductor being a predetermined angled spirangle originating at a first end and making a number of turns to a second end, wherein the plurality of straight line segments occupy substantially the same plane, with a subset of said plurality of line segments being outside said region, and a plurality of contacts on said surface being outside of the spirangle inductor being connected respectively to a plurality of contacts on said surface being connected to the power integrated circuit and enclosed by the spirangle inductor by a cross over metal layer without connecting to an end of the spirangle inductor.

10. The chip scale inductor substrate according to claim 9, wherein the conductive path has a thickness greater than 17 microns.

11. The chip scale inductor substrate according to claim 9, further comprising a plurality of magnetic core layers sandwiched by dielectric layers in superimposition with said spirangle inductor.

12. The chip scale inductor substrate according to claim 11, further comprising a magnetic core layer disposed over the spirangle inductor.

13. The chip scale inductor substrate according to claim 9, further comprising first and second magnetic core layers coupled by means of a magnetic core material via, with said spirangle inductor being positioned between said first and second magnetic core layers.

14. The chip scale inductor substrate according to claim 9, wherein the inductor substrate comprises a plurality of contacts surrounded by said plurality of line segments.

15. The chip scale inductor substrate according to claim 9, further comprising a low-K dielectric material in superimposition with said spirangle inductor to reduce parasitic capacitance.

16. A method of fabricating a chip scale power converter package comprising:
  providing a substrate having a surface;
  fabricating a plurality of spirangle inductors on the substrate to form a plurality of inductor substrates, with each of said spirangle inductors having a plurality of line segments, each spirangle inductor comprising the plurality of line segments being straight line segments, the plurality of straight line segments maximizing an inductance of the spirangle inductor, the spirangle inductor being a predetermined angled spirangle originating at a first end and making a number of turns to a second end, wherein the plurality of straight line segments occupy substantially the same plane;
  bonding an integrated circuit onto each spirangle inductor substrate in superimposition with a region of said surface, with a subset of said plurality of line segments being outside said region, and a plurality of contacts on said surface being outside of the spirangle inductor being connected respectively to a plurality of contacts on said surface being connected to the power integrated circuit and enclosed by the spirangle inductor by a cross over metal layer without connecting to an end of the spirangle inductor; and
  dicing the plurality of inductor substrates.

17. The method according to claim 16, further comprising forming a first oxide layer on the substrate before fabricating.

18. The method according to claim 17, further comprising depositing a first magnetic core material layer on the oxide layer before fabricating.

19. The method according to claim 18, further comprising depositing a second oxide layer on the magnetic core material layer before fabricating.

20. The method according to claim 19, further comprising depositing a cross over metal layer on the second oxide layer before fabricating.

21. The method according to claim 20, further comprising depositing a third oxide layer over the cross over metal layer before fabricating.

22. The method according to claim 21, further comprising depositing a dielectric material over the third oxide layer before fabricating.

23. The method according to claim 22, further comprising forming vias to the cross over metal layer before fabricating.

24. The method according to claim 23, further comprising etching exposed portions of the third oxide layer before fabricating.

25. The method according to claim 24, further comprising depositing a barrier metal layer on the dielectric material and exposed portions of the cross over metal layer before fabricating.

26. The method according to claim 25, further comprising depositing a seed layer on the barrier metal layer before fabricating.

27. The method according to claim 26, wherein the fabrication step comprises plating the plurality of spirangle inductors.

28. The method according to claim 27, wherein the fabrication step comprises patterning the plurality of spirangle inductors.

29. The method according to claim 28, further comprising etching exposed portions of the barrier metal and seed layers.

30. The method according to claim 29, further comprising depositing a first passivation layer.

31. The method according to claim 30, further comprising forming a peripheral via reaching the first magnetic core material layer.

32. The method according to claim 31, further comprising depositing a second magnetic core material layer.

33. The method according to claim 32, further comprising depositing a second passivation layer.

34. The method according to claim 33, further comprising forming contact pads in the vias.

35. The method according to claim 34, further comprising forming solder balls on the contact pads.

36. A power converter package comprising:
  an inductor substrate having an electrically conductive path formed from a plurality of line segments disposed on a surface, defining a spirangle inductor, the spirangle inductor comprising the plurality of line segments being straight line segments, the plurality of straight line segments maximizing an inductance of the spirangle inductor, the spirangle inductor being a predetermined angled spirangle having at least a four angle spirangle with the spirangle inductor originating at a first end and making a number of turns to a second end in a contiguous and unitary fashion, wherein the plurality of straight line segments occupy the general same plane with the plane being generally parallel to the inductor substrate; and
  a power integrated circuit bonded onto the spirangle inductor substrate, and in superimposition with a region of said surface, with a subset of said plurality of line segments lying outside of said region, and a plurality of contacts on said surface being outside of the spirangle inductor being connected respectively to a plurality of contacts on said surface being connected to the power integrated circuit and enclosed by the spirangle inductor by a cross over metal layer without connecting to an end of the spirangle inductor; and
  a magnetic element associated with the spirangle inductor, the magnetic element increasing the inductance per unit area of the spirangle inductor and the magnetic element providing shielding of stray magnetic fields, wherein the power converter package is used for greater than or equal to 5 MHz frequency applications.

* * * * *